US005680040A

United States Patent [19]

Kawai et al.

[11] Patent Number: 5,680,040
[45] Date of Patent: Oct. 21, 1997

[54] SYSTEM FOR DETECTING INCORRECT PHASE ROTATION

[75] Inventors: Jyoji Kawai, Kobe; Yuushin Yamamoto, Tokyo, both of Japan

[73] Assignee: Mitsubishi Denki Kabushiki Kaisha, Tokyo, Japan

[21] Appl. No.: 598,114

[22] Filed: Feb. 7, 1996

[30] Foreign Application Priority Data

Jun. 16, 1995 [JP] Japan .................................. 7-150446

[51] Int. Cl.$^6$ ............................................. G01R 25/00
[52] U.S. Cl. ....................... 324/86; 324/521; 324/76.77; 363/50
[58] Field of Search ........................... 324/76.77, 86, 324/521; 363/36, 50

[56] References Cited

U.S. PATENT DOCUMENTS

| | | |
|---|---|---|
| 4,641,088 | 2/1987 | Jacobsson ..................... 324/86 |
| 4,666,020 | 5/1987 | Watanabe . |
| 4,703,193 | 10/1987 | Kawabata . |
| 4,816,985 | 3/1989 | Tanahashi . |
| 4,944,369 | 7/1990 | Iwata . |
| 4,969,080 | 11/1990 | Kawabata et al. . |
| 5,034,874 | 7/1991 | Araki et al. . |
| 5,182,463 | 1/1993 | Yamamoto et al. . |
| 5,212,630 | 5/1993 | Yamamoto et al. . |
| 5,257,180 | 10/1993 | Sashida et al. . |
| 5,400,240 | 3/1995 | Araki . |
| 5,416,686 | 5/1995 | Azuma et al. . |
| 5,436,823 | 7/1995 | Araki . |
| 5,442,538 | 8/1995 | Ikeda et al. . |
| 5,446,647 | 8/1995 | Ikeda et al. . |

*Primary Examiner*—Ernest F. Karlsen
*Assistant Examiner*—Jose M. Solis
*Attorney, Agent, or Firm*—Leydig, Voit & Mayer, Ltd.

[57] ABSTRACT

A system for automatically detecting whether a power converter or inverter is correctly connected to a three-phase AC power source consisting of first, second, and third phases, the system comprising: a zero-crossing comparator (1) for determining whether the phase of the first-phase voltage (current) is in a positive half cycle or a negative half cycle and generating a first discrimination signal ($C_U$); a zero-crossing comparator (2, 3) for determining whether the phase of the second- or third-phase voltages (current) is in a positive half cycle or a negative half cycle and generating a second discrimination signal ($C_V$ or $C_W$); and a D-type flip-flop (5) which detects, in response to the first discrimination signal, that the second discrimination signal is in a predetermined half cycle.

6 Claims, 6 Drawing Sheets

SYSTEM FOR DETECTING INCORRECT PHASE ROTATION

BACKGROUND OF THE INVENTION

1. Field of the Invention

The present invention relates to a system for detecting incorrect phase rotation, and more particularly to a system for detecting whether a power converting apparatus such as a converter, inverter, etc. is correctly connected to a three-phase AC power system so that the phases of the power converter or inverter are consistent with the phases of the three-phase AC power system.

2. Description of the Related Art

In common AC-DC power converters, AC power is converted to DC power by switching, in a predetermined order, a plurality of semiconductor power switches disposed in individual phases of an input three-phase power source.

When such a converter is installed, if the three-phase AC power source is incorrectly connected to the three-phase input terminals of the converter in terms of phase order, the converter cannot operate to generate a normal DC output voltage and may even, in the worst case, destroy the converter.

On the other hand, a DC-AC power inverter converts DC power to AC power by switching, in a predetermined order, a plurality of semiconductor power switches disposed between the DC power source so that a three-phase AC voltage is thereby output at the output terminals of the inverter.

When the output of the inverter is connected to a three-phase AC power source it is required that the phase order of the inverter be consistent with that of the three-phase AC power source. If this is not the case overcurrent flows between the inverter and the AC power source which may destroy the device.

Therefore, when a power converter or inverter is installed, it is necessary to carefully check whether the AC power source is connected to the converter or inverter in such a manner that the phases of the AC power source are consistent with the phases at the AC input or output terminals of the converter or the inverter.

As described above, conventional converters or inverters have a problem in that an operator has to carefully check connections to prevent the power converters or inverters from being destroyed and to ensure that the converters or inverters operate correctly.

SUMMARY OF THE INVENTION

It is a general object of the present invention to solve the above problem. More specifically, it is an object of the present invention to provide a system for detecting incorrect phase rotation, which has the capability of automatically detecting whether a three-phase AC power source is correctly connected to a power converter or inverter.

According to a first aspect of the present invention, there is provided a system for detecting incorrect phase rotation in a three-phase AC power converting apparatus connected to a three-phase AC power system consisting of first, second, and third phases, the system comprising: first means for determining whether the phase of the first-phase is in a positive half cycle or a negative half cycle and generating a first discrimination signal; second means for determining whether the phase of the second- or third-phase is in a positive half cycle or a negative half cycle and generating a second discrimination signal; and third means which detects, in response to the first discrimination signal, that the second discrimination signal is in a predetermined half cycle. According to the system constructed in the above-described manner, it is possible to automatically detect incorrect phase rotation with simple hardware, which leads to savings in cost as well as labor.

In one form of the invention, each of the first and second means comprises an analog comparator, and the third means comprises a flip-flop. In the system constructed in the above-described manner, it is possible to automatically detect incorrect phase rotation with simple hardware, which leads to greater savings in cost and labor.

In another form of the invention, each of the first and second means comprises an analog comparator, and the third means is implemented by means of a microcomputer program.

According to the system constructed in the above-described manner, the flip-flop can be implemented by means of a program in an existing microcomputer and thus it is possible to achieve a greater economic advantage.

According to a second aspect of the present invention, there is provided a system for detecting incorrect phase rotation in a three-phase AC power converting apparatus connected to a three-phase AC power system consisting of first, second, and third phases, the system comprising: conversion means for converting the voltages of the first, second, and third phases into two-phase voltages consisting of d-axis and q-axis voltages which are out of phase by 90°; filters for removing double frequency components contained in the two-phase voltages of the q-axis and d-axis; squaring-and-addition means for obtaining squares of the respective two-phase voltages of the d-axis and q-axis filtered by the filters and further adding the squared values together; and judgement means for determining whether the output of the squaring-and-addition means is within a predetermined range. In the system constructed in the above-described manner, it is possible to achieve highly reliable automatic detection of incorrect phase rotation with simple hardware, which leads to savings in cost and labor.

In one form of the invention, the filters, the squaring-and-addition means, and judgement means are implemented by means of a microcomputer program. According to the system constructed in the above-described manner, the power converter or inverter is controlled by performing synchronous transformation of the three-phase rotation coordinate system to the d-q two-axis coordinate system by means of a program executed in an existing microcomputer. Thus, it is possible to automatically detect incorrect phase rotation without reliance upon any hardware, thereby making it possible to achieve an even greater savings in cost and labor.

According to a third aspect of the present invention, there is provided a system for detecting incorrect phase rotation in a three-phase AC power converting apparatus connected to a three-phase AC power system consisting of first, second, and third phases, the system comprising: conversion means for converting the voltages of the first, second, and third phases into two-phase voltages consisting of d-axis and q-axis voltages which are out of phase by 90°; a filter for removing double frequency components contained in the voltage of the d-axis; and judgement means for determining whether the d-axis voltage filtered by the filter is within a predetermined range; wherein the above conversion is performed so that the d-axis has the same phase as the first phase. In the system constructed in the above-described manner, it is possible to achieve highly reliable automatic detection of incorrect phase rotation with simple hardware, which leads to savings in cost and labor.

In one form of the invention, the filter and judgement means are implemented by means of a microcomputer program. In the system constructed in the above-described manner, the power converter or inverter is controlled by performing synchronous transformation of the three-phase rotation coordinate system to the d-q two-axis coordinate system wherein the transformation is performed so that the d-axis has the same phase as the first phase, and therefore it possible to detect incorrect phase rotation using a simple program.

According to a fourth aspect of the present invention, there is provided a system for detecting incorrect phase rotation in a three-phase AC power converting apparatus connected to a three-phase AC power system consisting of first, second, and third phases, the system comprising: conversion means for converting the voltages of the first, second, and third phases into two-phase voltages consisting of d-axis and q-axis voltages which are out of phase by 90°; and judgement means for determining whether the q-axis voltage is within a predetermined range; and, wherein the above-described conversion is performed so that the d-axis has the same phase as the first phase. In the system constructed in the above-described manner, it is possible to achieve highly reliable automatic detection of incorrect phase rotation with simple hardware, which leads to savings in cost and labor.

In another form of the invention, the filter and judgement means are implemented by means of a microcomputer program. In the system constructed in the above-described manner, the power converter or inverter is controlled by performing synchronous transformation of the three-phase rotation coordinate system to the d-q two-axis coordinate system wherein the transformation is performed so that the d-axis has the same phase as the first phase, and therefore it is possible to detect incorrect phase rotation using a simple program.

DESCRIPTION OF THE PREFERRED EMBODIMENTS

Embodiment 1

Referring to the accompanying drawings, a first embodiment of the present invention will be described below.

Figure 1:
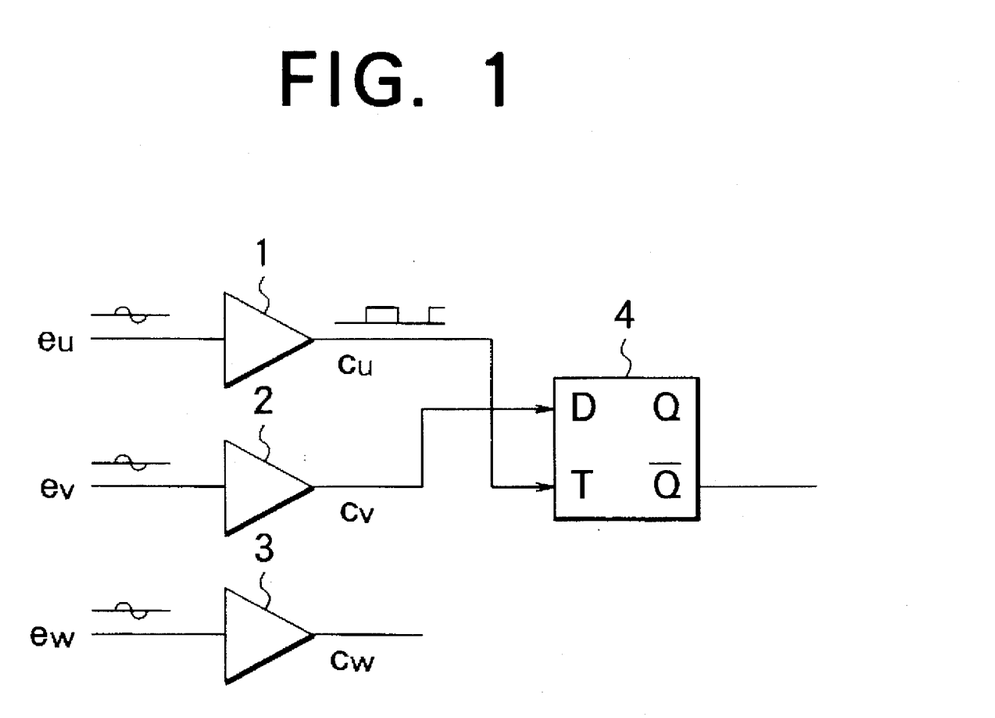
FIG. 1 is a block diagram of a first embodiment of a system for detecting incorrect phase rotation according to the present invention.

FIG. 1 is a block diagram of a first embodiment of a system for detecting incorrect phase rotation according to the present invention.

As shown in FIG. 1, the system for detecting incorrect phase rotation includes a zero-crossing comparator 1 serving as a first means, zero-crossing comparators 2 and 3 serving as a second means, and a D-type flip-flop 4 serving as a third means wherein the zero-crossing comparators 1, 2, and 3 are supplied respectively with the detection signals $e_U$, $e_V$, and $e_W$, of each of the phases of a three-phase AC power source (not shown), and the outputs of the zero-crossing comparators 1 and 2 are connected to the inputs T and D of the D-type flip-flop 4, respectively.

Figure 2:
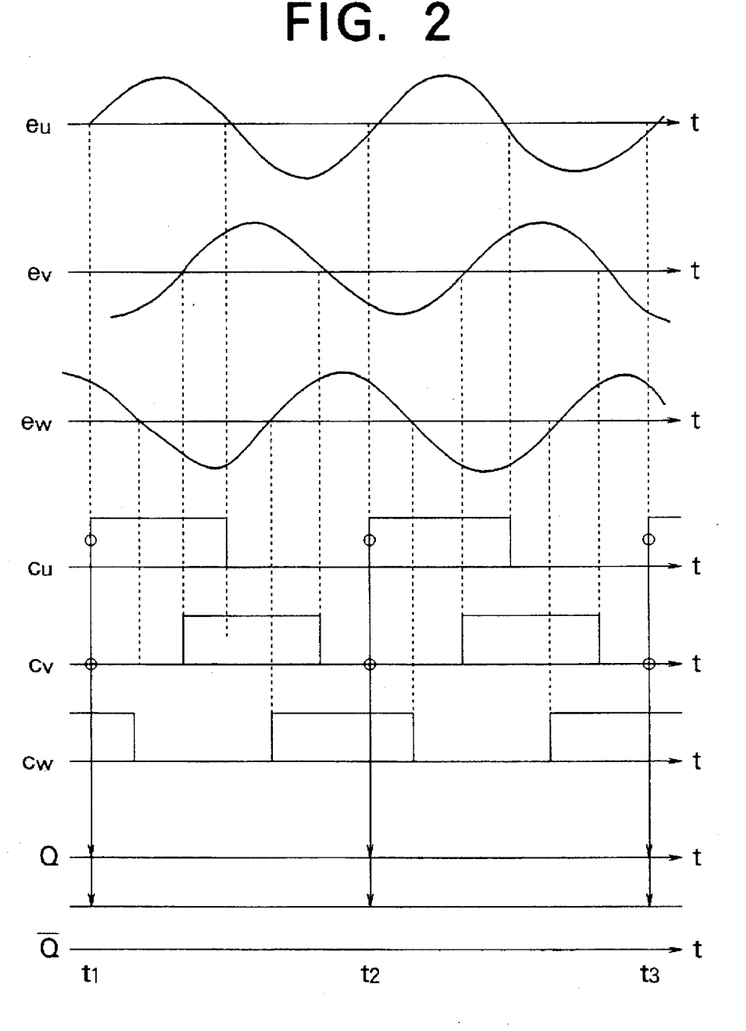
FIG. 2 is a timing chart relating to the operation of the system for detecting incorrect phase rotation according to the first embodiment of the present invention.

Referring to the signal waveforms shown in FIG. 2, the operation of the system for detecting incorrect phase rotation of the first embodiment will be described below.

The zero-crossing comparators 1, 2 and 3 shape the given detection signals $e_U$, $e_V$, and $e_W$ of the respective phases of the three-phase AC power source and provide logic signals $C_U$, $C_V$, and $C_W$ which vary alternately between logic high ("1") and logic low ("0") in response to each transition between positive and negative half cycles of the detection signals.

In response to the rising edges of the logic signal $C_U$ of the zero-crossing comparator 1, the D-type flip-flop 4 retains the logic signal $C_V$ at times $t_1$, $t_2$, $t_3$, ..., and outputs it at the output terminal Q. Since the inverted signal of the output Q appears at the inverted output terminal $\overline{Q}$, a logic signal "1" appears at the output terminal $\overline{Q}$ as shown in FIG. 2 as long as the phase rotation is normal. However, if the phases V and W are reversed, the D-type flip-flop 4 retains the logic signal $C_W$ at times $t_1$, $t_2$, $t_3$, ..., in response to the rising edges of the logic signal $C_U$, and therefore a logic signal "0" is output at output terminal $\overline{Q}$.

In this embodiment, as described above, incorrect phase rotation can be automatically detected using simple hardware including zero-crossing comparators and a D-type flip-flop.

In an alternative form, the D-type flip-flop may also be implemented by a software program and it may be incorporated into a control and operation program (not shown).

Embodiment 2

Figure 3:
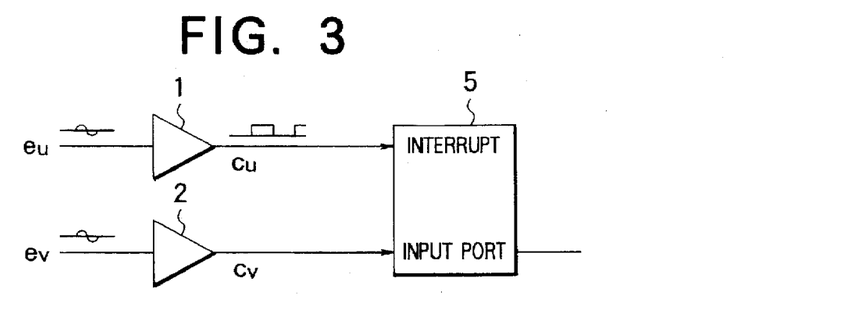
FIG. 3 is a block diagram of a second embodiment of a system for detecting incorrect phase rotation according to the present invention.

FIG. 3 is a block diagram of a second embodiment of a system for detecting incorrect phase rotation according to the present invention. In FIG. 3, portions similar to those shown in FIG. 1 are denoted by the same reference numerals or symbols as used in FIG. 1.

In this embodiment, the system for detecting incorrect phase rotation includes zero-crossing comparators 1 and 2 and a control microcomputer 5 serving as a third means wherein the detection signals $e_U$ and $e_V$ of the phase voltages of a three-phase AC power source are supplied to the zero-crossing comparators 1 and 2, respectively, the output of the zero-crossing comparator 1 is connected to the interrupt input terminal of the control microcomputer 5, and the output of the zero-crossing comparator 2 is connected to the input port of the control microcomputer 5.

The operation of this system for detecting incorrect phase rotation will be described below.

In recent years, microcomputers have been widely used to control various apparatuses and systems. The control microcomputer 5 is also installed in the power converter or inverter for similar purposes.

Figure 4:
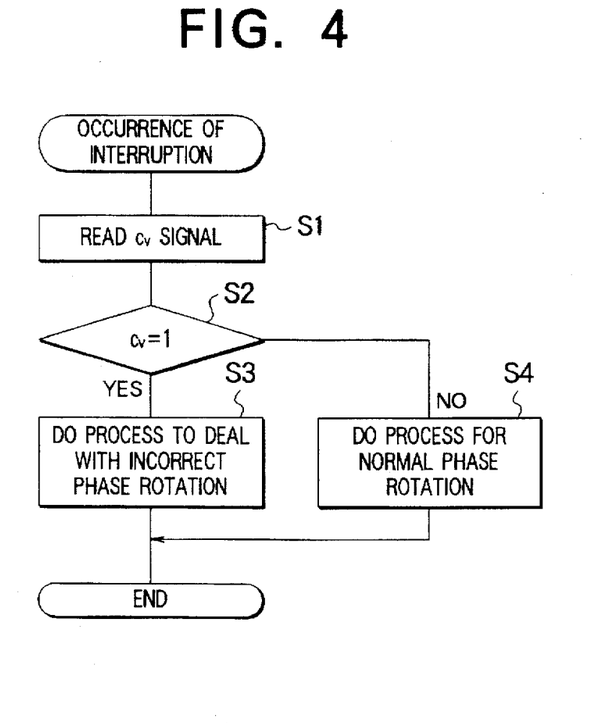
FIG. 4 is a flow chart relating to the operation of the system for detecting incorrect phase rotation according to the second embodiment of the present invention.

In this embodiment, a control program (not shown) includes a program such as that shown in FIG. 4 for detecting incorrect phase rotation. In step S1, in response to the rising edges of the logic signal $C_U$ output by the zero-crossing comparator 1, the control microcomputer 5 reads the logic value of the logic signal $C_V$ output by the zero-crossing comparator 2. Then, in step S2, the control microcomputer 5 determines whether the acquired logic signal is "1" or "0". If it is logic "1", then the control microcomputer 5 regards the phase rotation as incorrect, and in step S3 performs a process required to deal with the incorrect phase rotation. On the other hand, if the logic signal $C_V$ is "0", the control microcomputer 5 regards the phase rotation as correct, and in step S4 performs a process appropriate for correct phase rotation.

As described above, this embodiment needs no flip-flop, and is economically advantageous.

Embodiment 3

Figure 5:
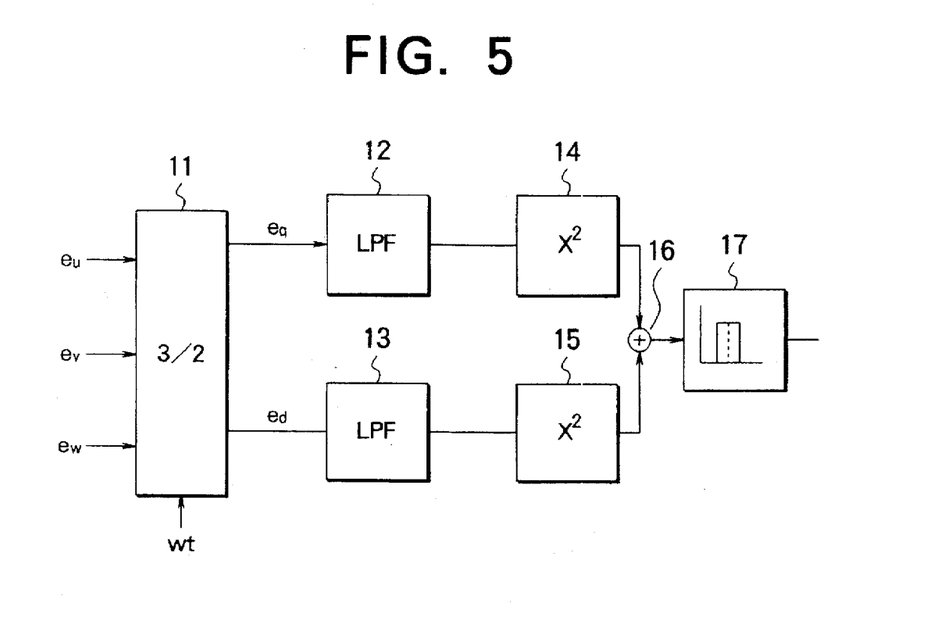
FIG. 5 is a block diagram of a third embodiment of a system for detecting incorrect phase rotation according to the present invention.

FIG. 5 is a block diagram of a third embodiment of a system for detecting incorrect phase rotation according to the present invention.

As shown in FIG. 5, the system for detecting incorrect phase rotation includes: three-phase to two-phase conversion means 11 for converting detection signals $e_U$, $e_V$, and $e_W$ of the respective phase voltages of a three-phase AC power source to two-phase detection signals $e_q$ and $e_d$; low-pass filters 12 and 13 for filtering the respective signals output by the three-phase to two-phase conversion means 11; squaring means 14 and 15 for obtaining squared values of the outputs of the low-pass filters 12 and 13; addition means 16 for adding together the results of the squaring means 14 and 15; and comparison means 17 for comparing the output of the addition means 16 with a predetermined range and saving as a discrimination means.

The operation of this system for detecting incorrect phase rotation will be described below.

The basic principle of detecting an abnormal phase rotation from two-phase voltages will be described first.

In recent years, voltage or current of a three-phase power converter or inverter are controlled by performing synchronous transformation of the three-pass rotation coordinate system to the d-q two-axis coordinate system as described for example in "Decoupling of d-q axes in discretization current control of three-phase inverter" (Paper No. 98 in "Proceedings of the Japan Industrial Applications Society Conference", 1987). In this control technique, detection values ($e_U$, $e_V$, $e_W$) of three-phase voltages are converted into d-q two-phase voltages ($e_q$, $e_d$) and the resultant d-q voltages are used for control, and for detection of incorrect phase rotation.

A three-phase expression including U-, V-, and W-phases can be converted into an expression of a d-q two-axis synchronous rotation coordinate system according to the transformation matrix C described below:

$$C = \sqrt{2/3} \begin{bmatrix} \cos\omega t & \cos(\omega t - 2\pi/3) & \cos(\omega t + 2\pi/3) \\ \sin\omega t & \sin(\omega t - 2\pi/3) & \sin(\omega t + 2\pi/3) \end{bmatrix}$$

$$e = \begin{bmatrix} e_U \\ e_V \\ e_W \end{bmatrix}$$

$$e_U = \sqrt{2}\ V_U \sin(\omega t + \phi_U)$$

$$e_V = \sqrt{2}\ V_V \sin(\omega t - 2\pi/3 + \phi_V)$$

$$e_W = \sqrt{2}\ V_W \sin(\omega t + 2\pi/3 + \phi_W)$$

$$e_X = \begin{bmatrix} e_q \\ e_d \end{bmatrix}$$

where e denotes a voltage in a three-phase expression, and $e_x$ denotes a voltage in d-q two-axis expression.

Thus, the relationship between the three-phase expression and the two-axis expression can be written as:

$$e_X = Ce$$

$$\begin{bmatrix} e_q \\ E_D \end{bmatrix} = \sqrt{2/3} \begin{bmatrix} \cos\omega t & \cos(\omega t - 2\pi/3) & \cos(\omega t + 2\pi/3) \\ \sin\omega t & \sin(\omega t - 2\pi/3) & \sin(\omega t + 2\pi/3) \end{bmatrix} \begin{bmatrix} e_U \\ e_V \\ e_W \end{bmatrix} \quad (1)$$

$e_q$ and $e_d$ can be obtained using equation (1) described above.

$e_q$ and $e_d$ can be expanded further using the trigonometric multiplication formula as follows:

$$\begin{aligned}
e_q &= 1/\sqrt{3}\ [V_U \sin\{(\omega t + \phi_U) - (\omega t)\} + \\
&\quad V_V \sin\{(\omega t - 2\pi/3 + \phi_V) - (\omega t - 2\pi/3)\} + \\
&\quad V_W \sin\{(\omega t + 2\pi/3 + \phi_W) - (\omega t + 2\pi/3)\} + \\
&\quad V_U \sin\{(\omega t + \phi_U) + (\omega t)\} + \\
&\quad V_V \sin\{(\omega t - 2\pi/3 + \phi_V) + (\omega t - 2\pi/3)\} + \\
&\quad V_W \sin\{(\omega t + 2\pi/3 + \phi_W) + (\omega t + 2\pi/3)\}] \\
&= 1/\sqrt{3}\ [\{V_U \sin\phi_U + V_V \sin\phi_V + V_W \sin\phi_W\} + \\
&\quad \{V_U \sin(2\omega t + \phi_U) + V_V \sin(2\omega t - 4\pi/3 + \phi_V) + \\
&\quad V_W \sin(2\omega t + 4\pi/3 + \phi_W)\}]
\end{aligned} \quad (2)$$

$$\begin{aligned}
e_d &= 1/\sqrt{3}\ [V_U \cos\{(\omega t + \phi_U) - (\omega t)\} + \\
&\quad V_V \cos\{(\omega t - 2\pi/3 + \phi_V) - (\omega t - 2\pi/3)\} + \\
&\quad V_W \cos\{(\omega t + 2\pi/3 + \phi_W) - (\omega t + 2\pi/3)\} + \\
&\quad V_U \cos\{(\omega t + \phi_U) + (\omega t)\} - \\
&\quad V_V \cos\{(\omega t - 2\pi/3 + \phi_V) + (\omega t - 2\pi/3)\} - \\
&\quad V_W \cos\{(\omega t + 2\pi/3 + \phi_W) + (\omega t + 2\pi/3)\}] \\
&= 1/\sqrt{3}\ [\{V_U \cos\phi_U + V_V \cos\phi_V + V_W \cos\phi_W\} - \\
&\quad \{V_U \cos(2\omega t + \phi_U) + V_V \cos(2\omega t - 4\pi/3 + \phi_V) + \\
&\quad V_W \cos(2\omega t + 4\pi/3 + \phi_W)\}]
\end{aligned} \quad (3)$$

The equations (2) and (3) represent two-phase voltages under the condition of normal phase rotation. Furthermore, if the three phases are balanced, then $V_U = V_V = V_W = V$, and $\phi_U = \phi_V = \phi_W = \phi$.

Thus, $$\begin{aligned}
e_q &= 1/\sqrt{3}\ [3V \cdot \sin\phi + \{V \cdot \sin(2\omega t + \phi) + \\
&\quad V \cdot \sin(2\omega t - 4\pi/3 + \phi) + V \cdot \sin(2\omega t + 4\pi/3 + \phi)\}] \\
&= \sqrt{3}\ V \cdot \sin\phi
\end{aligned} \quad (4)$$

$$\begin{aligned}
e_d &= 1/\sqrt{3}\ [3V \cdot \cos\phi - \{V \cdot \cos(2\omega t + \phi) + \\
&\quad V \cdot \cos(2\omega t - 4\pi/3 + \phi) + V \cdot \cos(2\omega t + 4\pi/3 + \phi)\}] \\
&= \sqrt{3}\ V \cdot \cos\phi
\end{aligned} \quad (5)$$

The above equations show that both $e_q$ and $e_d$ contain only a DC component independent of frequency.

That is, if it is assumed that the three phases are balanced, two-phase voltages $e_q$ and $e_d$ under the condition of normal phase rotation can be represented by the simple equations (4) and (5) described above.

If V- and W-phases are reversed, $e_q$ and $e_d$ evolve as follows:

$$e_q = 1/\sqrt{3} \ [V_U\sin\{(\omega t + \phi_U) - (\omega t)\} + \quad (2') $$
$$V_W\sin\{(\omega t - 2\pi/3 + \phi_W) - (\omega t - 2\pi/3)\} +$$
$$V_V\sin\{(\omega t + 2\pi/3 + \phi_V) - (\omega t + 2\pi/3)\} +$$
$$V_U\sin\{(\omega t + \phi_U) + (\phi t)\} +$$
$$V_W\sin\{(\omega t - 2\pi/3 + \phi_W) + (\omega t - 2\pi/3)\} +$$
$$V_V\sin\{(\omega t + 2\pi/3 + \phi_V) + (\omega t + 2\pi/3)\}]$$

$$= 1/\sqrt{3} \ [\{V_U\sin\phi_U + V_W\sin(4\pi/3 + \phi_W) +$$
$$V_V\sin(-4\pi/3 + \phi_V)\} + V_U\sin(2\omega t + \phi_U) + V_W\sin(2\omega t + \phi W) +$$
$$V_V\sin(2\omega t + \phi_V)\}]$$

$$e_d = 1/\sqrt{3} \ [V_U\cos\{(\omega t + \phi_U) - (\omega t)\} + \quad (3')$$
$$V_W\cos\{(\omega t - 2\pi/3 + \phi_W) - (\omega t - 2\pi/3)\} +$$
$$V_V\cos\{(\omega t + 2\pi/3 + \phi_V) - (\omega t + 2\pi/3)\} +$$
$$V_U\cos\{(\omega t + \phi_U) + (\omega t)\} -$$
$$V_W\cos\{(\omega t - 2\pi/3 + \phi_W) + (\omega t - 2\pi/3)\} -$$
$$V_V\cos\{(\omega t + 2\pi/3 + \phi_V) + (\omega t + 2\pi/3)\}]$$

$$= 1/\sqrt{3} \ [\{V_U\cos\phi_U + V_W\cos(4\pi/3 + \phi_W) +$$
$$\{V_V\cos(-4\pi/3 + \phi_V)\} -$$
$$V_U\cos(2\omega t + \phi_U) + V_W\cos(2\omega t + \phi_W) +$$
$$V_V\cos(2\omega t + \phi_V)\}]$$

Thus, when phase rotation is incorrect, two-phase voltages can be represented by the above equations (2') and (3').

Furthermore, if the three phases are balanced, then $V_U=V_V=V_W=V$, and $\phi_U=\phi_V=\phi_W=\phi$.

Thus, $$e_q = 1/\sqrt{3} \ V[\{\sin\phi + \sin(4\pi/3 + \phi) + \sin(-4\pi/3 + \phi)\} + \quad (4') $$
$$3\sin(2\omega t + \phi)]$$

$$= \sqrt{3} \ V \cdot \sin(2\omega t + \phi)$$

$$e_d = 1/\sqrt{3} \ V[\{\cos\phi + \cos(4\pi/3 + \phi) + \cos(-4\pi/3 + \phi)\} - \quad (5')$$
$$3\cos(2\omega t + \phi)]$$

$$= -\sqrt{3} \ V \cdot \cos(2\omega t + \phi)$$

Therefore, both $e_q$ and $e_d$ include an AC component at a double frequency.

That is, if it is assumed that the three phases are balanced, the two-phase voltages $e_q$ and $e_d$ under the condition of abnormal phase rotation can be represented by the simple equations (4') and (5') described above.

Now, the operation will be described referring to FIG. 5.

The three-phase to two-phase conversion means 11 inputs detection signals $e_U$, $e_V$, and $e_W$ of the individual phases of the three phase AC power source, and performs the operation represented by the above-described equation (1) on these input signals. As a result, two-phase signals (voltages) $e_q$ and $e_d$ represented by equations (4) and (5) or equations (4') and (5') above are output. Double frequency (2ωt) or higher components included in these signals $e_q$ and $e_d$ are removed by the low-pass filters 12 and 13, and then the squares of these signals $e_q$ and $e_d$ are calculated by the squaring means 14 and 15. The results are then added together by the adding means 16.

In the case of normal phase rotation conditions, the value of the sum of squares of the equations (4) and (5), that is, a constant value 3 $V^2$ can be obtained.

On the other hand, if phase rotation is incorrect, the components included in equations (4') and (5') are removed by the low-pass filters 12 and 13, and the sum of squares of equations (4') and (5') therefore becomes zero.

If the result of the sum of squares falls within the range 3 $V^2 \pm \alpha$ ($\alpha$ being a variable amount), then the comparison means 17 outputs a logic signal "1" which indicates that the phase rotation is correct. If the sum falls outside the range, the comparison means 17 outputs a logic signal "0" which indicates that the phase rotation is incorrect.

The voltage of each phase may vary around a known value by a certain amount. The variable amount $\alpha$ is determined by taking into account the above variation.

Alternatively, the comparison means 17 may output a logic signal "0" when the sum of squares is equal or nearly equal to zero, and output a logic signal "1" in all the other cases.

Figure 6:
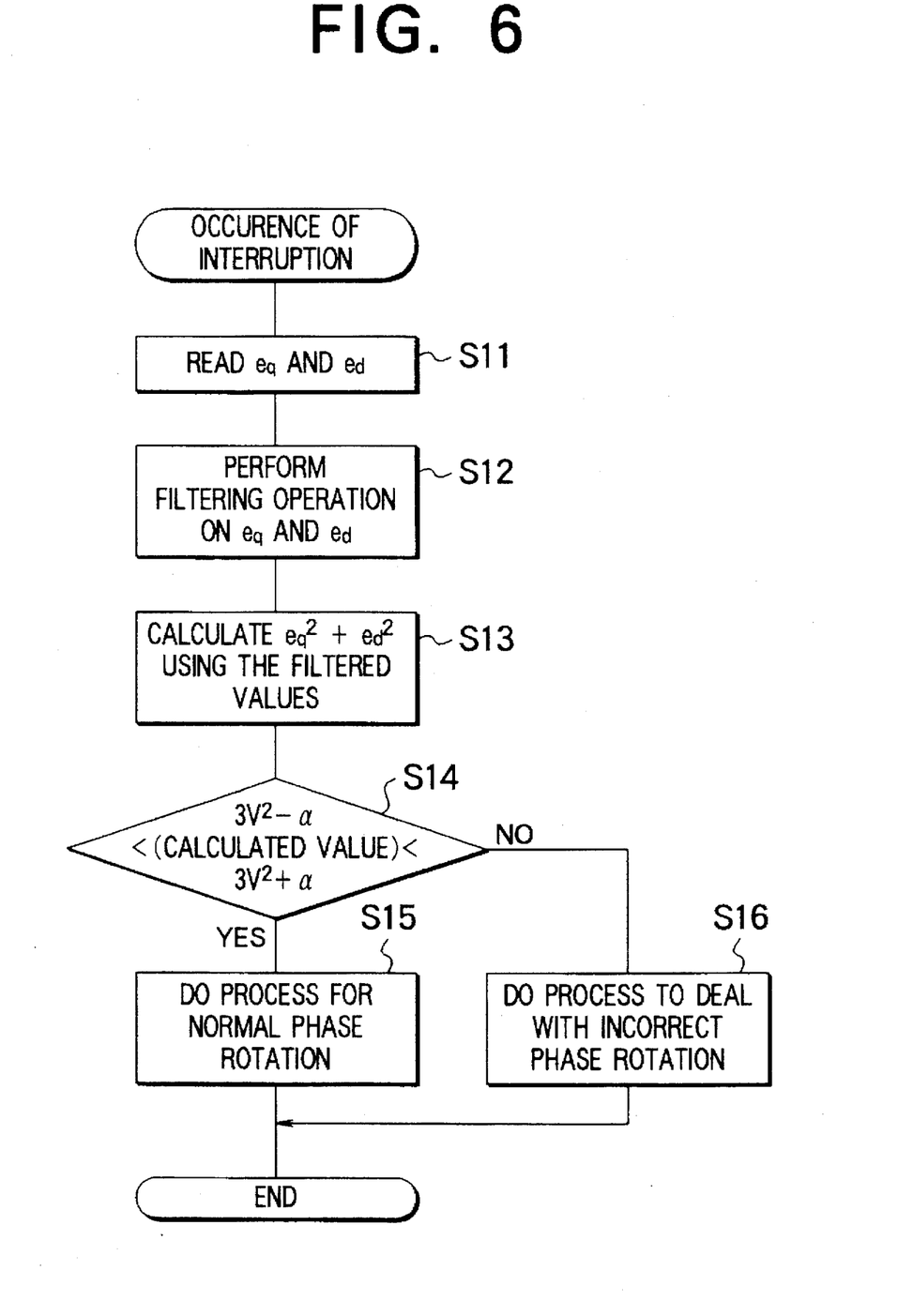
FIG. 6 is a flow chart relating to the operation of the system for detecting incorrect phase rotation according to the third embodiment of the present invention.

Furthermore, when the power converter or inverter is controlled by performing synchronous transformation of the three-phase rotation coordinate system to the d-q two-axis coordinate system, as the operations are complicated a microcomputer is generally used. In this case, since the $e_q$ and $e_d$ values have already been obtained, the low-pass filters 12 and 13, the squaring means 14 and 15, the addition means 16, and the comparison means 17 are implemented by means of a program and incorporated into the control and operation program (not shown). FIG. 6 is a flow chart illustrating the operation according to the above program.

First, the microcomputer reads the two-phase voltages $e_q$ and $e_d$ output by the three-phase to two-phase conversion means 11 (step S11). Then, these voltages $e_q$ and $e_d$ are subjected to a low-pass filter operation so that double or higher frequency (2ωt or greater) components are removed (step S12). The results are then individually squared, and the squared values are added together (step S13).

If the phase rotation is correct, the result is equal to a constant value 3 $V^2$ which is obtained by the sum of squares of equations (4) and (5).

However, if the phase rotation is incorrect, the components in the above-described equations (4') and (5') are removed by the low-pass filter operation and thus the sum of the squares becomes zero.

Next, it is determined whether the sum of the squares, $\pm\alpha$ ($\alpha$ being a variable amount) (step S14). If so, then the microcomputer outputs a logic signal "1" indicating that the phase rotation is normal (step S15). In all other cases, the microcomputer outputs a logic signal "0" indicating that the phase rotation is incorrect (step S16).

The judgement condition (step S14) portion of FIG. 6, may be replaced by (addition result) >$\beta$, where $\beta$ is a variable amount determined by taking into account detection errors.

In this embodiment, as described above, incorrect phase rotation can be automatically detected using simple hardware. Furthermore, all elements of the system for detecting incorrect phase rotation are implemented by a program and the program is incorporated into the control and operation program. Thus, the present embodiment has an advantage that no hardware is required.

Embodiment 4

Figure 7:
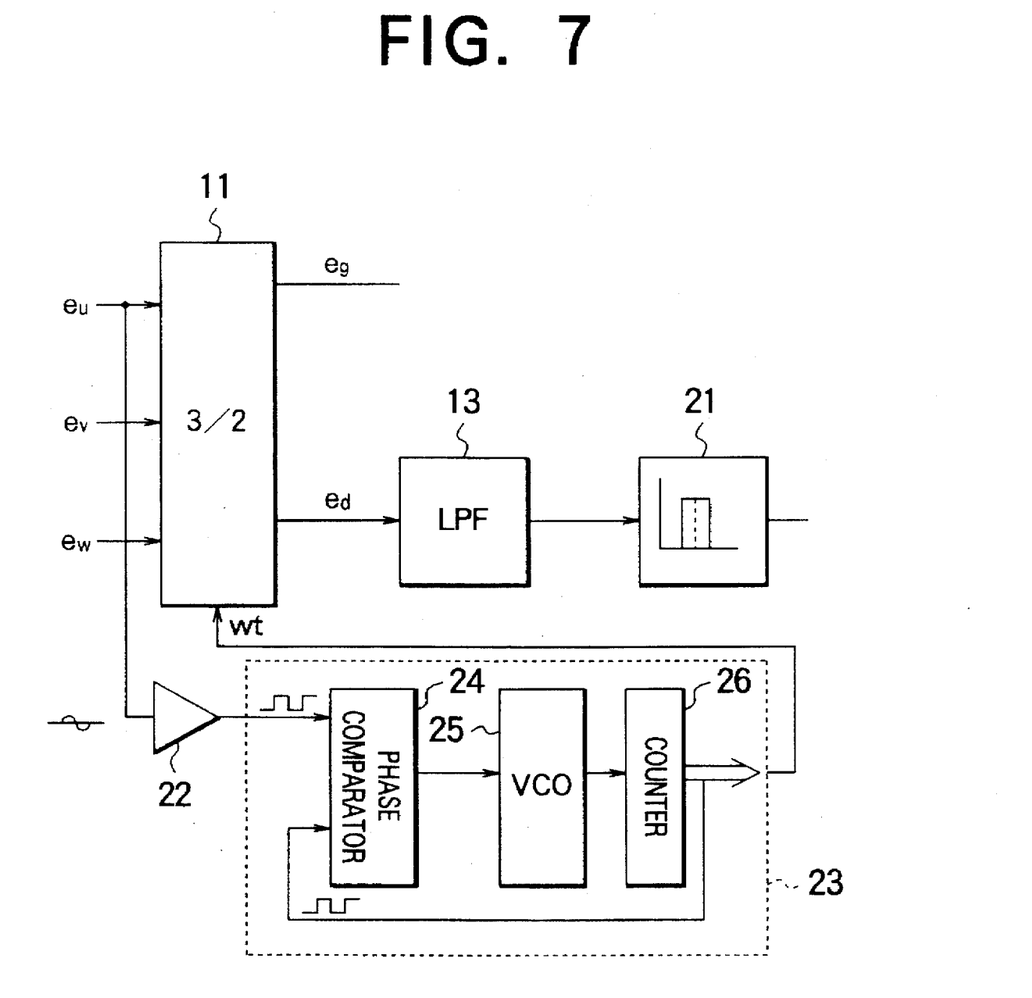
FIG. 7 is a block diagram of a fourth embodiment of a system for detecting incorrect phase rotation according to the present invention.

FIG. 7 is a block diagram of a fourth embodiment of a system for detecting incorrect phase rotation according to the present invention. In FIG. 7, portions similar to those shown in FIG. 5 are denoted by the same reference numerals or symbols as used in FIG. 5.

As shown in FIG. 7, the system for detecting incorrect phase rotation of the present embodiment includes: three-phase to two-phase conversion means 11 for converting detection signals $e_U$, $e_V$, and $e_W$ of the respective phase voltages of a three-phase AC power source to two-phase detection signals $e_q$ and $e_d$; a low-pass filter 13 for filtering the signal output by the three-phase to two-phase conversion means 11; comparison means 21 as a discrimination means for comparing the output of the low-pass filter 13 with a predetermined value; a zero-crossing comparator 22 to which a detection signal, for example $e_U$ of a first phase voltage, is input; and a PLL circuit 23 disposed between the zero-crossing comparator 22 and the three-phase to two-phase conversion means 11, by which the d-axis is made to have the same phase as the first phase of the three-phase to two-phase conversion means 11. The three-phase to two-phase conversion means 11, the zero-crossing comparator 22, and the PLL circuit 23 constitute the conversion means.

The PLL circuit 23 includes: a phase comparator 24 for comparing the phase of the output of the zero-crossing comparator 22 with a reference phase; a voltage controlled oscillator (VCO) 25 for generating a signal whose frequency is controlled by a control voltage equal to a comparison error signal given by the phase comparator 24; and a binary counter 26 for counting the output of the voltage controlled oscillator 25 wherein the counting result is supplied as the output of the PLL circuit 23 to the three-phase to two-phase conversion means 11, and also supplied as the reference phase to the phase comparator 24.

The operation of this system for detecting incorrect phase rotation will be described below.

In techniques for controlling power converters or inverters similar to the third embodiment described above, in order to make the control operation easier, the phase of the d-axis is made to coincide with the first phase of the three-phase AC power system. A PLL (phase locked loop) technique is generally used to achieve the above-described phase coincidence.

An ωt-signal in the form of a binary value output by the binary counter 26 is supplied to the three-phase to two-phase conversion means 11 whereby the PLL circuit 23 operates so as to make that the counting period phase of the binary counter 26 coincide with the period phase of the first phase of the three-phase voltages.

For example, if the phase of the counter 26 advances beyond the first phase of the three-phase voltages, then the phase comparator 24 detects this phase advancement and outputs a signal which causes the VCO 25 to lower its oscillation frequency. As a result of the reduction in the oscillation frequency of the VCO 25, the counting rate of the binary counter 26 decreases and the phase of the counter is thus delayed.

On the other hand, if the phase of the binary counter 26 is delayed relative to the first phase of the three-phase voltages, then the phase comparator 24 detects this phase delay and outputs a signal which causes the VCO 25 to increase its oscillation frequency.

As a result of the increase in the oscillation frequency of the VCO 25, the counting rate of the binary counter 26 increases and thus the phase of the counter is advanced. Since the PLL circuit 25 always operates in the above-described manner, the PLL circuit 25 reaches a stable condition in which the phase of the binary counter 26 is coincident with the first phase of the three-phase voltages.

In this control technique in which the d-axis has the same phase as the first phase of the three-phase voltages, the phase φ becomes zero.

Thus, when the phase rotation is normal, $e_q$ and $e_d$ have the values described by equations (6) and (7) shown below, respectively. On the other hand, when the phase rotation is incorrect, $e_q$ and $e_d$ have the values described by equations (6') and (7') shown below, respectively.

| | |
|---|---|
| $e_q = 0$ | (6) |
| $e_d = \sqrt{3}\, V$ | (7) |
| $e_q = \sqrt{3}\, V \cdot \sin(2\omega t)$ | (6') |
| $e_d = -\sqrt{3}\, V \cdot \cos(2\omega t)$ | (7') |

In FIG. 7, the three-phase to two-phase conversion means 11 outputs a first-phase voltage $e_d$ having a value given by either equation (7) or (7').

This first-phase voltage $e_d$ is applied to the low-pass filter 13, and double or higher frequency components (2ωt or higher components) are removed. As a result, the low-pass filter 13 outputs a constant voltage $\sqrt{3}\, V$ when the phase rotation is correct. On the other hand, if the phase rotation is incorrect, the components contained in equation (7') are removed by low-pass filter 13 and thus the output of the low-pass filter 13 becomes zero.

If the output of the low-pass filter 13 is within the range of $\sqrt{3}\, V \pm \gamma$, the comparison means 21 outputs a logic signal "1" indicating that the phase rotation is correct. In all other cases, the comparison means 21 outputs a logic signal "0" indicating that the phase rotation is incorrect.

V is a known value varying within a certain range, and the variable amount γ is determined taking into account the above variable range.

Alternatively, the comparison means 21 may output a logic signal "0" when the output of the low-pass filter 13 is equal or nearly equal to zero, and output a logic signal "1" in all the other cases.

Figure 8:
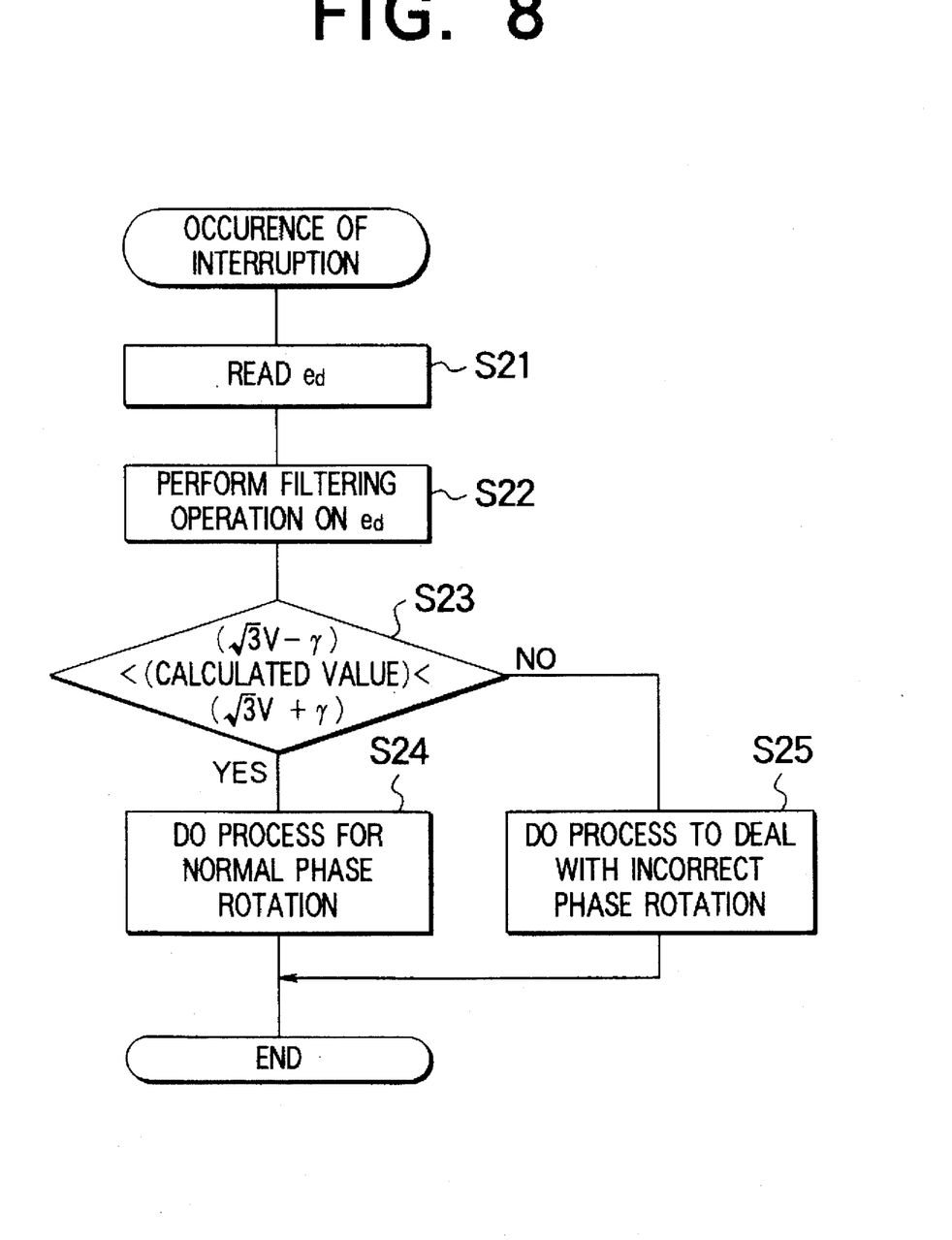
FIG. 8 is a flow chart relating to the operation of the system for detecting incorrect phase rotation according to the fourth embodiment of the present invention.

Furthermore, as the operations are complicated a microcomputer is generally used to control the power converter or inverter. In such cases, since $e_q$ and $e_d$ have already been obtained, the low-pass filter 13, and the addition means 21 are implemented by means of a program and the resultant program is incorporated into the control and operation program (not shown). FIG. 8 is a flow chart illustrating the operation according to the above program.

First, the microcomputer reads a first-phase voltage $e_d$ output by the three-phase to two-phase conversion means 11 (step S21). Then, the voltage $e_d$ is subjected to a low-pass filter operation so that double or higher frequency (2ωt or greater) components are removed (step S22).

Then, it is determined whether the result of the operation, that is, the result of step S22, is within the range of $\sqrt{3}\, V \pm \gamma$ (γ being a variable amount) (step S23). If so, then the microcomputer outputs a logic signal "1" indicating that the phase rotation is normal (step S24). In all other cases, the microcomputer outputs a logic signal "0" indicating that the phase rotation is incorrect (step S25).

In the case where the q-axis is employed instead of the d-axis to detect incorrect phase rotation, the filtering process for removing double or higher frequency components is skipped and an acquired signal $e_q$ is directly subjected to a comparison process (step S23) wherein the comparison condition (step S23 in FIG. 8) is replaced by −δ<addition result<δ, where δ is a variable amount determined by taking into account detection errors.

As can be seen from above, in the present embodiment, a power converter or inverter is controlled so that the d-axis coincides with the first phase of the three-phase voltages, and thus the present embodiment has an advantage that the operation of detecting abnormal phase rotation can be programmed in a simpler manner than the third embodiment described above.

What is claimed is:

1. A system for detecting incorrect phase rotation in a three-phase AC power converting apparatus connected to a three-phase AC power system consisting of first, second, and third phases, said system comprising:

conversion means for converting the voltages of said first, second, and third phases into two-phase voltages consisting of d-axis and q-axis voltages which are out of phase by 90°, said conversion means being connected to said three-phase AC power system; and means for determining that the phase rotation is incorrect when said q-axis voltage is out of a predetermined range;

wherein said conversion is performed so that said q-axis has the same phase as said first phase.

2. The system for detecting incorrect phase rotation of claim 1, wherein said filter and said means for determining include a programmed microcomputer.

3. A system for detecting incorrect phase rotation in a three-phase AC power converting apparatus connected to a three-phase AC power system consisting of first, second, and third phases, said system comprising:

conversion means for converting the voltages of said first, second, and third phases into two-phase voltages consisting of d-axis and q-axis voltages which are out of phase by 90°, said conversion means being connected to said three-phase AC power system;

a filter connected to said conversion means, said filter being adapted to remove double frequency components contained in the two-phase voltages of said q-axis and d-axis;

squaring-and-addition means for obtaining squares of the respective two-phase voltages of the d-axis and q-axis filtered by said filter and for adding the squared values together, said squaring and addition means being connected to said filter; and means for determining that the phase rotation is incorrect when the output of said squaring-and-addition means is out of a predetermined range, said means for determined being connected to said squaring-and-addition means.

4. The system for detecting incorrect phase rotation of claim 3, wherein said filters, said squaring-and addition means, and said means for determining include a programmed microcomputer.

5. A system for detecting incorrect phase rotation in a three-phase AC power converting apparatus connected to a three-phase AC power system consisting of first, second, and third phases, said system comprising;

conversion means for connecting the voltages of said first, second, and third phases into two-phase voltages consisting of d-axis and q-axis voltages which are out of phase by 90°, said conversion means being connected to said three-phase AC power system;

a filter connected to said conversion means, said filter being adapted to remove double frequency components contained in the d-axis voltage; and means for determining that the phase rotation is incorrect when said, axis voltage filtered by said filter is out of a predetermined range, said means for determining being connected to said filter;

wherein said conversion is performed so that the d-axis has the same phase as said first phase.

6. The system for detecting incorrect phase rotation of claim 5, wherein said filter and said means for determining include a programmed microcomputer.

* * * * *

UNITED STATES PATENT AND TRADEMARK OFFICE
CERTIFICATE OF CORRECTION

PATENT NO.   : 5,680,040
DATED        : October 21, 1997
INVENTOR(S)  : Kawai et al.

It is certified that error appears in the above-indentified patent and that said Letters Patent is hereby corrected as shown below:

Column 12, Line 30, ", axis" should read --d-axis--.

Signed and Sealed this

Twelfth Day of May, 1998

Attest:

BRUCE LEHMAN

Attesting Officer

Commissioner of Patents and Trademarks